US009685589B2

United States Patent
Bergbauer et al.

(10) Patent No.: US 9,685,589 B2
(45) Date of Patent: Jun. 20, 2017

(54) OPTOELECTRONIC COMPONENT WITH A LAYER STRUCTURE

(71) Applicant: OSRAM Opto Semiconductors GmbH, Regensburg (DE)

(72) Inventors: Werner Bergbauer, Windberg (DE); Philipp Drechsel, Regensburg (DE); Peter Stauss, Regensburg (DE); Patrick Rode, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 21 days.

(21) Appl. No.: 14/427,687

(22) PCT Filed: Sep. 25, 2013

(86) PCT No.: PCT/EP2013/069973
§ 371 (c)(1),
(2) Date: Mar. 12, 2015

(87) PCT Pub. No.: WO2014/048991
PCT Pub. Date: Apr. 3, 2014

(65) Prior Publication Data
US 2015/0228858 A1    Aug. 13, 2015

(30) Foreign Application Priority Data
Sep. 27, 2012    (DE) .................. 10 2012 217 631

(51) Int. Cl.
*H01L 33/32* (2010.01)
*H01L 21/02* (2006.01)
(Continued)

(52) U.S. Cl.
CPC ........ *H01L 33/325* (2013.01); *H01L 21/0254* (2013.01); *H01L 21/02381* (2013.01);
(Continued)

(58) Field of Classification Search
CPC ..... H01L 33/007; H01L 33/32; H01L 33/325; H01L 33/025; H01L 33/12
See application file for complete search history.

(56) References Cited

U.S. PATENT DOCUMENTS 8,946,773 B2 * 2/2015 Tak ..................... H01L 29/267
257/190
2008/0128678 A1    6/2008 Lee
(Continued)

FOREIGN PATENT DOCUMENTS

DE          101 51 092 A1    5/2003
DE    10 2011 114 665 A1    4/2013
(Continued)

OTHER PUBLICATIONS

A. Dadgar et al., "Metalorganic chemical vapor phase epitaxy of gallium-nitride on silicon," phys. stat. sol. (c), vol. 0, No. 6, Aug. 12, 2003, pp. 1583-1606.
(Continued)

*Primary Examiner* — Bilkis Jahan
*Assistant Examiner* — Victor Barzykin
(74) *Attorney, Agent, or Firm* — DLA Piper LLP (US)

(57) ABSTRACT

An optoelectronic component includes a layer structure which has a first gallium nitride layer and an aluminum-containing nitride intermediate layer. In this case, the aluminum-containing nitride intermediate layer adjoins the first gallium nitride layer. The layer structure has an undoped second gallium nitride layer which adjoins the aluminum-containing nitride intermediate layer.

10 Claims, 2 Drawing Sheets

(51) Int. Cl.
  *H01L 33/00* (2010.01)
  *H01L 33/12* (2010.01)
  *H01L 33/02* (2010.01)

(52) U.S. Cl.
  CPC .. *H01L 21/02458* (2013.01); *H01L 21/02488* (2013.01); *H01L 21/02505* (2013.01); *H01L 33/007* (2013.01); *H01L 33/025* (2013.01); *H01L 33/12* (2013.01); *H01L 33/32* (2013.01)

(56) References Cited

U.S. PATENT DOCUMENTS

| | | | | |
|---|---|---|---|---|
| 2008/0220555 | A1* | 9/2008 | Saxler | H01L 21/02381 438/47 |
| 2010/0244096 | A1 | 9/2010 | Sato | |
| 2012/0074385 | A1* | 3/2012 | Tak | H01L 21/02381 257/15 |
| 2013/0270575 | A1* | 10/2013 | Humphreys | H01L 21/02381 257/76 |

FOREIGN PATENT DOCUMENTS

| | | | |
|---|---|---|---|
| EP | 1 875 523 B1 | 1/2008 | |
| EP | 2 434 532 A1 | 3/2012 | |
| GB | 2485418 A * | 5/2012 | ....... H01L 21/02381 |
| WO | 2007/096405 A1 | 8/2007 | |

OTHER PUBLICATIONS

A. Krost et al., "GaN-based epitaxy on silicon: stress measurements," phys. stat. sol. (a), vol. 200, No. 1, Nov. 1, 2003, pp. 26-35.
S. Fritze et al., "Role of low-temperature AlGaN interlayers in thick GaN on silicon by metalorganic vapor phase epitaxy," Journal of Applied Physics, 111, Jun. 20, 2012, pp. 124505-1-124505-6.

* cited by examiner

OPTOELECTRONIC COMPONENT WITH A LAYER STRUCTURE

TECHNICAL FIELD

This disclosure relates to an optoelectronic component comprising a layer structure and also to a method of producing a layer structure for an optoelectronic component.

BACKGROUND

It is known to use nitride compound semiconductors in optoelectronic components such as light-emitting diodes or laser diodes. To produce optoelectronic components of this type, nitride compound semiconductor layers are grown epitaxially onto a substrate. Suitable substrate materials are sapphire, GaN or SiC, for example. Production of these substrate materials is associated with high costs, however.

Epitaxial growth of nitride compound semiconductors on silicon substrates obtainable at low cost is made more difficult by the fact that silicon and nitride compound semiconductors have greatly differing coefficients of thermal expansion. Growth of the nitride compound semiconductor is effected at temperatures of approximately 1000° C. If the layer system thus produced is then cooled, the silicon substrate and the nitride compound semiconductor material contract to differing extents, as a result of which tensile stresses arise, and these can result in damage to the layer structure.

EP 1 875 523 B1 inserts aluminum-containing intermediate layers between a silicon surface of a growth substrate and a functional layer sequence of a layer structure of an optoelectronic component to generate compressive stressing, which compensates for the tensile stresses that arise during cooling, in the layer structure which forms.

It could therefore be helpful to provide an optoelectronic component comprising a layer structure as well as a method of producing a layer structure for an optoelectronic component.

SUMMARY

We provide a nitride semiconductor component including a layer structure having a first gallium nitride layer and an aluminum-containing nitride intermediate layer, wherein the aluminum-containing nitride intermediate layer adjoins the first gallium nitride layer, and the layer structure has an undoped second gallium nitride layer that adjoins the aluminum-containing nitride intermediate layer.

We also provide a method of producing a layer structure for a nitride semiconductor component including depositing a first gallium nitride layer, depositing an aluminum-containing nitride intermediate layer on the first gallium nitride layer, and depositing an undoped second gallium nitride layer on the aluminum-containing nitride intermediate layer.

We further provide a nitride semiconductor component including a layer structure having a first gallium nitride layer and an aluminum-containing nitride intermediate layer, wherein the aluminum-containing nitride intermediate layer adjoins the first gallium nitride layer, the layer structure has an undoped second gallium nitride layer that adjoins the aluminum-containing nitride intermediate layer, the layer structure has a third gallium nitride layer, the third gallium nitride layer has a silicon doping which is variable perpendicular to the layer plane, and the third gallium nitride layer adjoins the second gallium nitride layer.

We further yet provide a nitride semiconductor component including a layer structure having a first gallium nitride layer and an aluminum-containing nitride intermediate layer, wherein the aluminum-containing nitride intermediate layer adjoins the first gallium nitride layer, the layer structure has an undoped second gallium nitride layer that adjoins the aluminum-containing nitride intermediate layer, and the aluminum-containing nitride intermediate layer has a thickness of 5 nm to 100 nm.

LIST OF REFERENCE SIGNS

Figure 1:
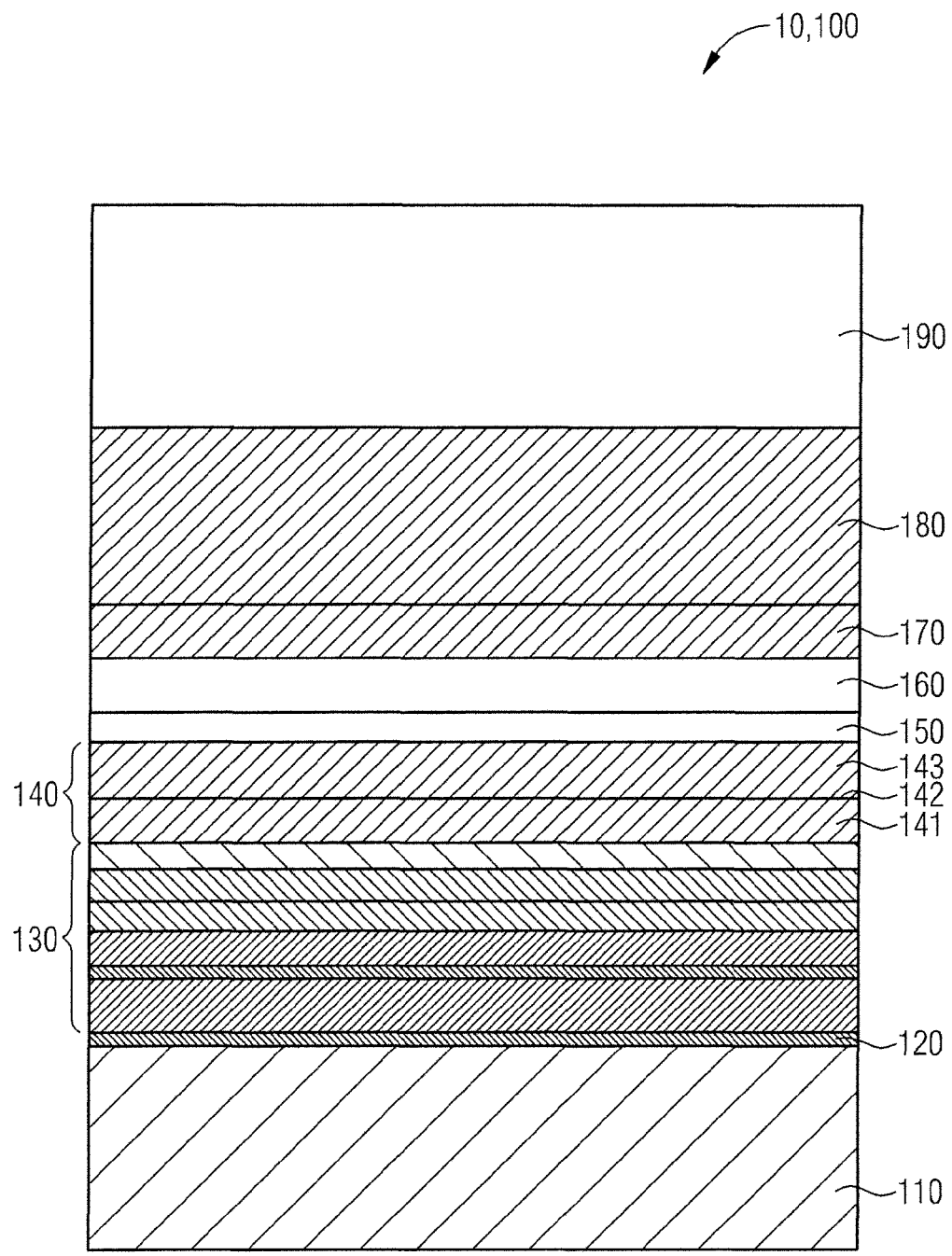
FIG. 1 shows a schematic illustration of a layer structure of an optoelectronic component.

10 Optoelectronic component
100 Layer structure
110 Substrate
120 Nucleation layer
130 Buffer layer
140 First gallium nitride layer
141 First sub-layer
142 Masking layer
143 Second sub-layer
150 Nitride intermediate layer
160 Second gallium nitride layer (undoped)
170 Third gallium nitride layer (gradient-doped)
180 Fourth gallium nitride layer (current distribution layer)
190 LED layer structure
200 Curvature graph
201 Time
202 Curvature
210 First curvature profile (highly doped)
220 Second curvature profile (lightly doped)
230 Third curvature profile (undoped)

DETAILED DESCRIPTION

Our optoelectronic component comprises a layer structure having a first gallium nitride layer and an aluminum-containing nitride intermediate layer. In this case, the aluminum-containing nitride intermediate layer adjoins the first gallium nitride layer. Moreover, the layer structure has an undoped second gallium nitride layer that adjoins the aluminum-containing nitride intermediate layer. We found that higher compressive stressing can build up in the layer structure when the aluminum-containing nitride intermediate layer is followed by an undoped gallium nitride layer in the direction of growth. This can bring about increased compensation of a tensile stress caused by a substrate during cooling of the layer structure.

The undoped second gallium nitride layer may have a thickness of 30 nm to 2000 nm. We found that an undoped gallium nitride layer having a thickness in this range brings about a particularly considerable increase in the desired compressive stressing.

The layer structure may have a third gallium nitride layer. In this case, the third gallium nitride layer has a silicon doping which is variable perpendicular to the layer plane. In this case, the third gallium nitride layer adjoins the second gallium nitride layer. We found that provision of a third gallium nitride layer of this type additionally promotes formation of desired compressive stressing in the layer structure.

The third gallium nitride layer may have a thickness of 20 nm to 500 nm. We found that a gallium nitride layer having a thickness from this range brings about a particularly considerable effect in the production of compressive stressing in the layer structure.

Doping the third gallium nitride layer may increase proceeding from the interface with the second gallium nitride layer. A gradient doping of this nature can bring about a particularly considerable increase in the compressive stressing which arises in the layer structure.

The first gallium nitride layer may have a thickness of 500 nm to 2000 nm. A first gallium nitride layer having a thickness from this range can cause compressive stressing to arise in the layer structure.

A masking layer comprising silicon nitride may be embedded into the first gallium nitride layer. Such an embedded masking layer can bring about a reduction in dislocation density in the first gallium nitride layer, as a result of which a dislocation density in further layers of the layer structure which follow in the direction of growth is also reduced.

The aluminum-containing nitride intermediate layer may have a thickness of 5 nm to 100 nm. An aluminum-containing nitride intermediate layer having a thickness from this range brings about a particularly low dislocation density in the following layers of the layer structure.

A proportion of aluminum in the aluminum-containing nitride intermediate layer may increase in the direction of the undoped second gallium nitride layer. We found that an aluminum proportion that increases in the direction of growth brings about particularly favorable compressive stressing.

The proportion of aluminum in the aluminum-containing nitride intermediate layer may be at least doubled between the first gallium nitride layer and the undoped second gallium nitride layer. We found that such an increase in the aluminum proportion in the direction of growth brings about particularly favorable compressive stressing.

A proportion of aluminum in the aluminum-containing nitride intermediate layer may be at least 40% with respect to a proportion of gallium. We found that compressive stressing brought about by the aluminum-containing nitride intermediate layer assumes a particularly favorable value given such a high average aluminum proportion.

The layer structure may have a fourth gallium nitride layer having a silicon doping. In this case, the fourth gallium nitride layer adjoins the second gallium nitride layer or the third gallium nitride layer. The fourth gallium nitride layer can serve as a current distribution layer in the layer structure of the optoelectronic component.

The layer structure may comprise an LED layer structure that adjoins the fourth gallium nitride layer. The optoelectronic component is then a light-emitting diode.

The layer structure may have a plurality of first gallium nitride layers and aluminum-containing nitride intermediate layers, which follow one another alternately. A layer structure having a plurality of such gallium nitride layers and aluminum-containing nitride intermediate layers can have particularly high compressive stressing.

The layer structure may be arranged on a silicon substrate. Compressive stressing formed in the layer structure can in this respect compensate for a tensile stress which arises during cooling of the layer structure and of the silicon substrate. Damage to the optoelectronic component is thereby avoided.

A method of producing a layer structure for an optoelectronic component comprises steps of depositing a first gallium nitride layer, depositing an aluminum-containing nitride intermediate layer on the first gallium nitride layer, and depositing an undoped second gallium nitride layer on the aluminum-containing nitride intermediate layer. The method makes it possible to generate compressive stressing in the layer structure which can compensate for a tensile stress which arises during cooling of the layer structure.

The method may comprise a further step of depositing a third gallium nitride layer on the second gallium nitride layer, wherein the third gallium nitride layer is deposited with a silicon doping that increases in the direction of growth. This method makes it possible to produce a layer structure with particularly high compressive stressing. As a result, it is also possible for large tensile stresses which arise to be compensated for in this layer structure to avoid damage to the layer structure.

The method may comprise a further step of depositing a fourth gallium nitride layer deposited with a silicon doping. The fourth gallium nitride layer can then serve as a current distribution layer.

The method may comprise a further step of depositing an LED layer structure on the fourth gallium nitride layer. The layer structure produced can then produce a light-emitting diode.

The above-described properties, features and advantages and also the way in which they are achieved will become clearer and more clearly understandable in association with the following description of the examples, which are explained in more detail in conjunction with the drawing.

FIG. 1 shows a schematic illustration of a layer structure 100 of an optoelectronic component 10. The optoelectronic component 10 can be a light-emitting diode, for example. In FIG. 1, the optoelectronic component 10 has not yet been completed. To complete the optoelectronic component 10, the layer structure 100 can also be patterned, electrically contact-connected and packaged, for example.

To produce the layer structure 100, first, provision is made for a substrate 110. The substrate 110 can be a substrate having a low coefficient of thermal expansion. By way of example, the substrate 110 can be a cost-effective silicon substrate in the form of a silicon wafer. The substrate 110 can, however, also be an SOI substrate, for example.

A nucleation layer or seeding layer 120 is first deposited on a surface of the substrate 110. The nucleation layer 120 comprises AlN and can also comprise proportions of GaIn and $O_2$.

In a subsequent method step, a buffer layer 130 is grown on the nucleation layer 120. The buffer layer 130 comprises AlN and can additionally comprise GaN. Moreover, the buffer layer 130 can also comprise In and $O_2$. The buffer layer 130 can have a thickness of 100 nm to 300 nm, for example. As shown in FIG. 1, the buffer layer 130 can comprise a plurality of sub-layers which differ in terms of their composition and/or the growth parameters used in the production thereof.

The buffer layer 130 can improve the crystal quality of the layer structure 100. In particular, the buffer layer 130 can reduce a dislocation density in the layers of the layer structure 100 which follow the buffer layer 130 in the direction of growth of the layer structure 100.

In a subsequent method step in the production of the layer structure 100 of the optoelectronic component 10, a first gallium nitride layer 140 is grown on the buffer layer 130. The first gallium nitride layer 140 can be doped or undoped. By way of example, the first gallium nitride layer 140 can have a silicon doping.

As shown in FIG. 1, the first gallium nitride layer 140 can have an embedded masking layer 142. In this case, the first gallium nitride layer 140 comprises a first sub-layer 141 and a second sub-layer 143. The masking layer 142 is arranged here between the first sub-layer 141 and the second sub-layer 143. The masking layer 142 can contribute to a reduction in a dislocation density in following layers of the layer structure 100.

The masking layer 142 comprises silicon nitride (SiN). The masking layer 142 has a very thin form in the direction of growth and on average can have a thickness of 0.2 nm to 2 nm, for example. In particular, the masking layer 142 can be an insular layer, i.e., a layer of which the growth is interrupted still in the initial stage before the crystallites formed on the surface of growth grow together to form a closed layer. In this case, the masking layer 142 thus has a multiplicity of openings.

The first sub-layer 141 can be considerably thinner than the second sub-layer 143. The first sub-layer 141 can even be dispensed with entirely such that the masking layer 142 directly adjoins the buffer layer 130. In total, the first gallium nitride layer 140 can have a thickness of 500 nm to 2000 nm, for example.

In a subsequent method step, an aluminum-containing nitride intermediate layer 150 is grown onto the first gallium nitride layer 140. The aluminum-containing nitride intermediate layer 150 comprises AlN or AlGaN. The aluminum-containing nitride intermediate layer 150 can have a thickness of 5 nm to 100 nm. By way of example, the aluminum-containing nitride intermediate layer 150 can have a thickness of approximately 30 nm.

The aluminum-containing material of the nitride intermediate layer 150 has a lower lattice constant than GaN. As a result, the nitride intermediate layer 150 brings about compressive stressing in subsequently grown layers of the layer structure 100 which comprise GaN. The higher the aluminum proportion in the aluminum-containing nitride intermediate layer 150, the greater the compressive stressing.

The nitride intermediate layer 150 may consist entirely of AlN. The proportion of aluminum can vary in relation to the proportion of gallium within the nitride intermediate layer 150 and, in this case, can be 20% to 95%, for example. The proportion of aluminum preferably increases in relation to the proportion of gallium in the direction of growth of the nitride intermediate layer and preferably rises to at least twice its initial value. The aluminum proportion in the nitride intermediate layer 150 preferably lies on average above 40%.

In one example of the method of producing the layer structure 100, the steps applying the first gallium nitride layer 140 and the nitride intermediate layer 150 are repeated several times in alternation. In the layer structure 100 which forms, the nitride intermediate layer 150 is then followed by a further first gallium nitride layer 140, with or without a masking layer 142. The further first gallium nitride layer 140 is followed in turn by a further aluminum-containing nitride intermediate layer 150. This sequence can be repeated several times.

In a subsequent method step of producing the layer structure 100 of the optoelectronic component 10, a second gallium nitride layer 160 is grown on the nitride intermediate layer 150. The second gallium nitride layer 160 can have a thickness of 30 nm to 2000 nm. The second gallium nitride layer 160 comprises GaN and is not doped.

We found that doping of the second gallium nitride layer 160 reduces the compressive stressing brought about by the aluminum-containing nitride intermediate layer 150. Formation of the second gallium nitride layer 160 as an undoped layer therefore brings about higher compressive stressing of the layer structure 100 than would be the case if the second gallium nitride layer 160 were to be formed as a doped layer.

In an optional further step of producing the layer structure 100 of the optoelectronic component 10, a third gallium nitride layer 170 is grown on the second gallium nitride layer 160. The growth of the third gallium nitride layer 170 can also be dispensed with entirely, however. The third gallium nitride layer 170 can further increase the compressive stressing formed in the layer structure 100.

The third gallium nitride layer 170 can be grown with a thickness of 20 nm to 500 nm. The third gallium nitride layer 170 comprises GaN and is doped with silicon. In this respect, the third gallium nitride layer 170 has a variable doping in the direction of growth. It is preferable that the third gallium nitride layer 170 has an increasing degree of doping in the direction of growth. In this respect, the doping can increase, by way of example, from 0 up to a value of, for example, $1.5 \times 10^{18}/cm^3$ or $5 \times 10^{18}/cm^3$ in the direction of growth of the third gallium nitride layer 170.

In a further method step of producing the layer structure 100 of the optoelectronic component 10, a fourth gallium nitride layer 180 is grown. If the third gallium nitride layer 170 has been grown in the preceding method step, the fourth gallium nitride layer 180 is grown on the third gallium nitride layer 170. Otherwise, the fourth gallium nitride layer 180 is grown on the second gallium nitride layer 160.

The fourth gallium nitride layer 180 comprises GaN and can have a thickness of 1000 nm to 3000 nm, for example. The fourth gallium nitride layer 180 is highly doped. By way of example, the fourth gallium nitride layer 180 can have a silicon doping with a degree of doping of $1 \times 10^{19}/cm^3$. The fourth gallium nitride layer 180 can serve as a current distribution layer of the layer structure 100 of the optoelectronic component 10.

In a further method step of producing the layer structure 100, a functional layer structure 190 is grown onto the fourth gallium nitride layer 180. The functional layer structure 190 can be an LED layer structure, for example. The functional layer structure 190 then comprises a light-emitting active layer.

After the layer structure 100 has been produced by epitaxial growth, the layer structure 100 is cooled. Owing to the different coefficients of thermal expansion of the substrate 110 and the rest of the layers of the layer structure 100, tensile stressing or tensile stresses arise here, these being compensated for by the compressive stressing incorporated in the layer structure 100. This counteracts damage to the layer structure 100.

Figure 2:
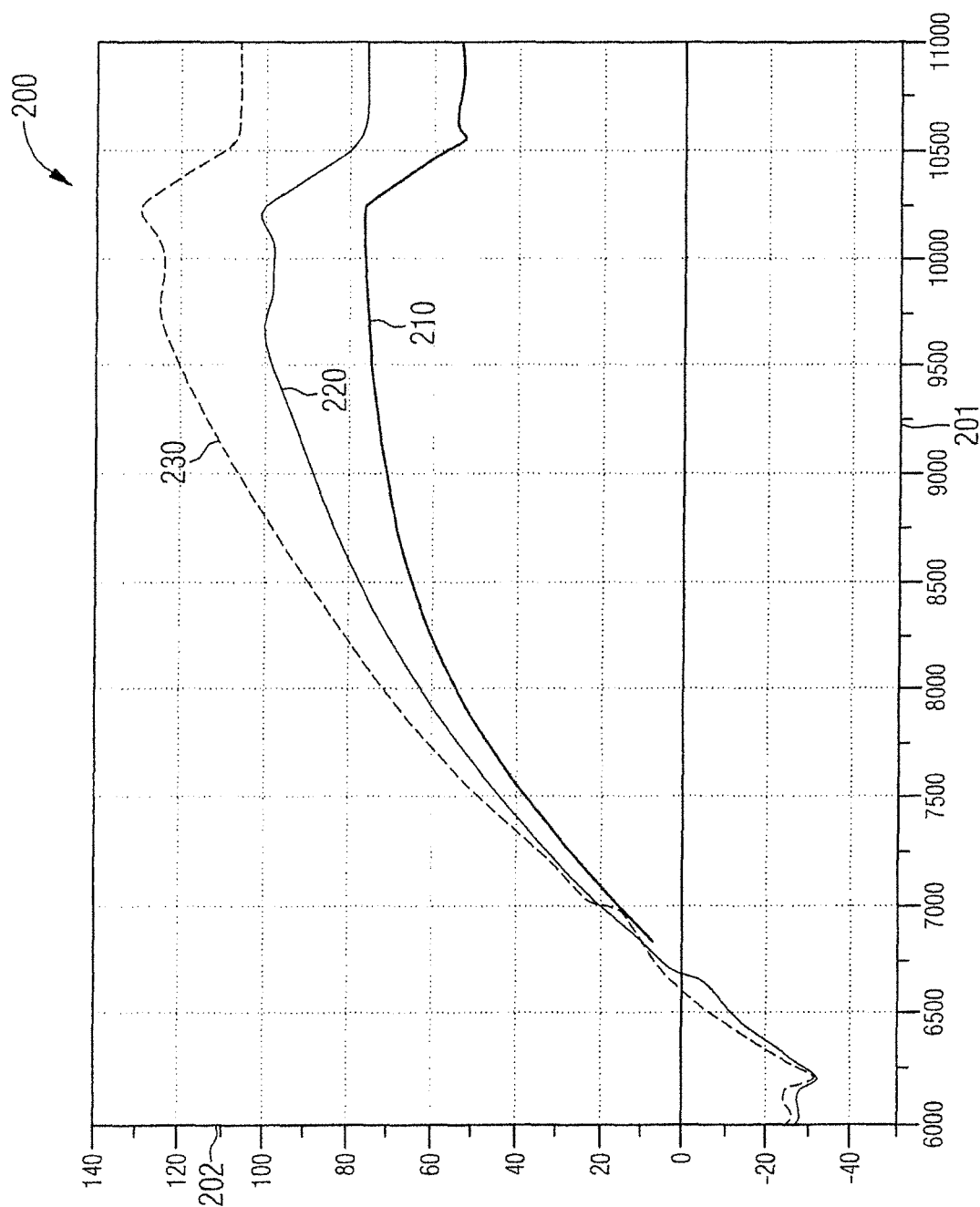
FIG. 2 shows a curvature graph comparing different layer structures.

Through forming the second gallium nitride layer 160 as an undoped layer, the compressive stressing applied in the layer structure 100 during the epitaxial growth of the layer structure 100 can assume a higher value here than would be the case if the gallium nitride layer 160 is grown as a doped layer. To illustrate this point, FIG. 2 shows a curvature graph 200.

A growth time 201 in seconds is plotted on a horizontal axis of the curvature graph 200. The time indicated is a time which has elapsed during the growth of the second gallium nitride layer 160 and therefore correlates with the thickness of the second gallium nitride layer 160. A curvature 202 of the layer structure 100 in 1/km is plotted on a vertical axis of the curvature graph 200. A greater curvature here denotes higher compressive stressing in the layer structure 100 and is therefore desirable.

A first curvature profile 210 indicates the time-dependent increase in curvature for a first sample, in which the gallium nitride layer following the aluminum-containing nitride intermediate layer has been highly doped. A second curvature profile 220 indicates the time-dependent development in curvature for a second sample, in which the gallium nitride layer following the aluminum-containing nitride intermediate layer has been lightly doped with silicon. A third curvature profile 230 indicates the development in curvature for a layer structure 100, in which the second gallium nitride layer 160 following the aluminum-containing nitride intermediate layer 150 has been grown in undoped form.

The highest curvature is achieved in the case of the layer structure 100 having an undoped second gallium nitride layer 160 as per the third curvature profile 230. Therefore, the greatest possible compressive stressing is applied in the layer structure 100 as per the third curvature profile 230. As a result, a tensile stress that arises during cooling of the layer structure 100 after the growth of the layer structure 100 can be compensated for to the most comprehensive extent in the layer structure 100 as per the third curvature profile 230. As a result, the layer structure 100 having an undoped second gallium nitride layer 160 as per the third curvature profile 230 has the lowest probability of damage occurring during the cooling of the layer structure 100.

Our components and methods have been illustrated and described in greater detail on the basis of the preferred examples. Nevertheless, this disclosure is not limited to the examples. Instead, other variations can be derived therefrom by those skilled in the art without departing from the scope of protection as defined in the appended claims.

The invention claimed is:

1. A nitride semiconductor component comprising a layer structure having a first gallium nitride layer and an aluminum-containing nitride intermediate layer,
   wherein the aluminum-containing nitride intermediate layer adjoins the first gallium nitride layer,
   the layer structure has an undoped second gallium nitride layer adjoining the aluminum-containing nitride intermediate layer,
   the layer structure has a third gallium nitride layer,
   the third gallium nitride layer has a silicon doping which is variable perpendicular to the layer plane,
   the third gallium nitride layer adjoins the second gallium nitride layer,
   doping of the third gallium nitride layer increases proceeding from an interface with the second gallium nitride layer,
   the layer structure has a fourth gallium nitride layer,
   the fourth gallium nitride layer has a silicon doping,
   the fourth gallium nitride layer adjoins the third gallium nitride layer,
   the layer structure comprises an LED layer structure adjoining the fourth gallium nitride layer, and
   a proportion of aluminum increases throughout the aluminum-containing nitride intermediate layer in a direction of the undoped second gallium nitride layer.

2. The nitride semiconductor component according to claim 1, wherein the undoped second gallium nitride layer has a thickness of 30 nm to 2000 nm.

3. The nitride semiconductor component according to claim 1, wherein the third gallium nitride layer has a thickness of 20 nm to 500 nm.

4. The nitride semiconductor component according to claim 1, wherein the first gallium nitride layer has a thickness of 500 nm to 2000 nm.

5. The nitride semiconductor component according to claim 1, further comprising a masking layer comprising silicon nitride embedded into the first gallium nitride layer.

6. The nitride semiconductor component according to claim 1, wherein the aluminum-containing nitride intermediate layer has a thickness of 5 nm to 100 nm.

7. The nitride semiconductor component according to claim 1, wherein the proportion of aluminum in the aluminum-containing nitride intermediate layer is at least doubled between the first gallium nitride layer and the undoped second gallium nitride layer.

8. The nitride semiconductor component according to claim 1, wherein the layer structure has a plurality of first gallium nitride layers and aluminum-containing nitride intermediate layers which alternately follow one another.

9. The nitride semiconductor component according to claim 1, wherein the layer structure is arranged on a silicon substrate.

10. A nitride semiconductor component comprising a layer structure having a first gallium nitride layer and an aluminum-containing nitride intermediate layer,
   wherein the aluminum-containing nitride intermediate layer adjoins the first gallium nitride layer,
   the layer structure has an undoped second gallium nitride layer adjoining the aluminum-containing nitride intermediate layer,
   the layer structure has a third gallium nitride layer,
   the third gallium nitride layer has a silicon doping which is variable perpendicular to the layer plane,
   the third gallium nitride layer adjoins the second gallium nitride layer,
   doping of the third gallium nitride layer increases proceeding from an interface with the second gallium nitride layer,
   the layer structure has a fourth gallium nitride layer,
   the fourth gallium nitride layer has a silicon doping,
   the fourth gallium nitride layer adjoins the third gallium nitride layer,
   the layer structure comprises an LED layer structure adjoining the fourth gallium nitride layer,
   the fourth gallium nitride layer has a thickness of 1000 nm to 3000 nm, and
   a proportion of aluminum increases throughout the aluminum-containing nitride intermediate layer in a direction of the undoped second gallium nitride layer.

* * * * *